United States Patent [19]

Shigenaka

[11] Patent Number: 4,868,622
[45] Date of Patent: Sep. 19, 1989

[54] SEMICONDUCTOR LIGHT-DETECTING DEVICE WITH ALLOYED ISOLATING REGION

[75] Inventor: Keitaro Shigenaka, Tokyo, Japan

[73] Assignee: Kabushiki Kaisha Toshiba, Kawasaki, Japan

[21] Appl. No.: 113,069

[22] Filed: Oct. 27, 1987

[30] Foreign Application Priority Data

Nov. 18, 1986 [JP] Japan ................... 61-274313

[51] Int. Cl.$^4$ ............................... H01L 27/14
[52] U.S. Cl. ........................ 357/30; 357/16; 357/4; 357/51; 357/61; 357/32; 437/19
[58] Field of Search ............... 357/30 B, 30 E, 30 H, 357/16, 4, 61, 51, 91, 45, 47, 48, 49, 50, 32, 30 P, 7; 437/24, 19

[56] References Cited

U.S. PATENT DOCUMENTS

| | | | |
|---|---|---|---|
| 4,198,251 | 4/1980 | Gaffre ........................ | 357/45 X |
| 4,290,825 | 9/1981 | Dearnaley et al. .......... | 437/24 X |
| 4,373,678 | 2/1983 | Castro ........................ | 357/16 X |
| 4,511,408 | 4/1985 | Holonyak, Jr. ............. | 148/1.5 |
| 4,594,603 | 6/1986 | Holonyak, Jr. ............. | 357/16 |
| 4,771,010 | 9/1988 | Epler et al. ................ | 437/24 X |

FOREIGN PATENT DOCUMENTS 57-72369  5/1982  Japan ................... 357/30 H

OTHER PUBLICATIONS

Gansauge, "Junction Isolation in Germanium by Alloy Process", *IBM Technical Disclosure Bulletin*, vol. 9, No. 6, Nov. 1966, p. 692.
Epler et al., "Laser Induced Disordering of GaAs-Al-GaAs Superlattice and ANb Incorporation of Si Impurity", *Appl. Phys. Lett.*, 49 (21), 24 Nov. 1986, pp. 1447-1449.
Favrie et al., "II-II Semiconductor Compounds: New Superlattice Systems for the Future", *Journal of Crystal Growth*, 72 (1985) 111-116.
Kobayashi et al., "Realization of Both P- and N-Type Conduction for ZnSe-ZnTe Strained-Layer Superlattices," *Appl. Phys. Lett.* 51, (20), 16 Nov. 87, 1602-1604.
Bleicher, "Group II-II Compounds in Optoelectronics," *Funk-Technik*, vol. 31, No. 20, Oct. 76, pp. 644-645, 648-649, 652.
Levinstein, "Infrared Detectors," *Physics Today*, Nov. 1977, pp. 23-28.

Primary Examiner—William A. Mintel
Attorney, Agent, or Firm—Oblon, Spivak, McClelland, Maier & Neustadt

[57] ABSTRACT

A semiconductor light detecting device comprises a substrate, a first stacked layer of a first conductivity type formed on the substrate by alternately laminating a compound semimetal layer and a compound semiconductor layer repeatedly, a second stacked layer of a second conductivity type formed on the first stacked layer by alternately laminating the compound semimetal layer and the compound semiconductor layer repeatedly, and an isolation region formed by selectively irradiating the first and second stacked layers with an energy beam. A plurality of light detecting elements isolated from each other by the isolation region are formed on the substrate so as to provide the semiconductor light detecting device.

6 Claims, 3 Drawing Sheets

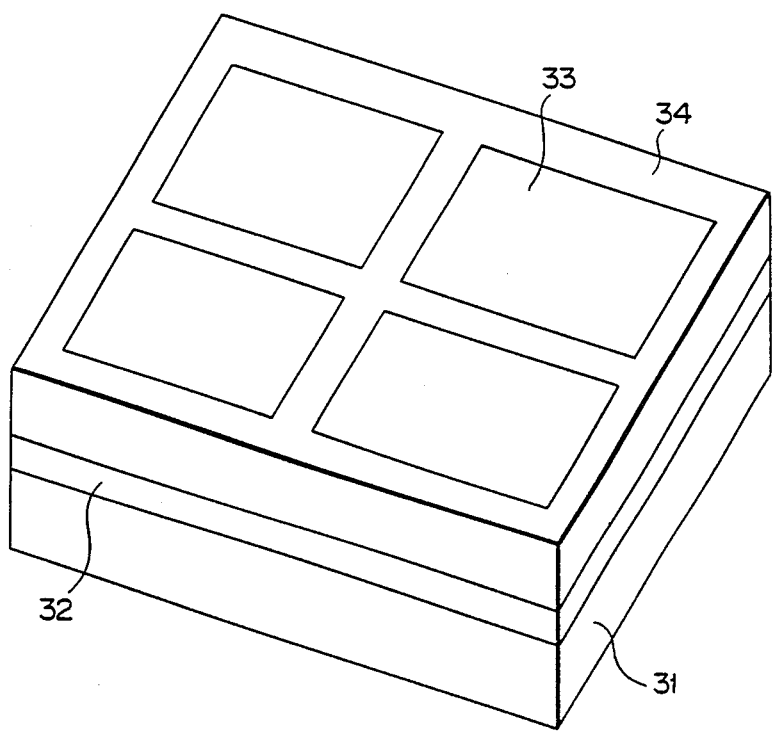
F I G. 3A
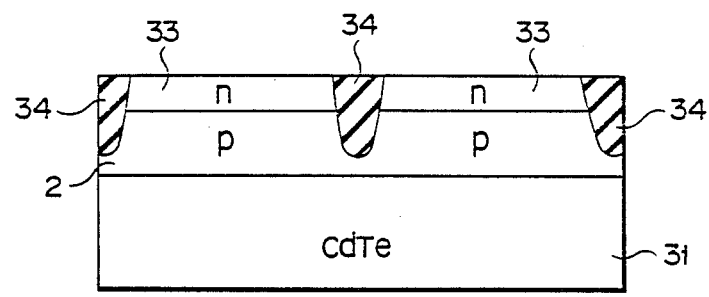
F I G. 3B

SEMICONDUCTOR LIGHT-DETECTING DEVICE WITH ALLOYED ISOLATING REGION

BACKGROUND OF THE INVENTION

I. Field of the Invention

The present invention relates to a semiconductor light-detecting device and a method of producing the same, particularly, a semiconductor light-detecting device having a plurality of light-detecting elements integrally arranged therein and a method of producing the same.

II. PRIOR ART

Known is an infrared image sensor formed by integrally arranging in two dimensional directions a plurality of infrared detecting elements using a HgCdTe crystal. FIG. 1 exemplifies the known infrared image sensor of this type. It is seen that the infrared image sensor is obtained by selectively forming n-type layers 12 of a high impurity concentration in the surface region of p-type HgCdTe single crystal substrate 11. n-type layers 12 are formed by ion implantation of an impurity such as boron or diffusion of indium or mercury. Alternatively, the infrared image sensor may be obtained by selectively forming the n-type layers in a p-type HgCdTe epitaxial layer formed by, for example, an LPE process on a suitable substrate. In the prior art shown in FIG. 1, the element isolation is performed by p-type HgCdTe single crystal substrate 11 itself.

FIG. 2 shows another prior art infrared image sensor. In this case, p-type HgCdTe layer 22 is formed by epitaxial growth on CdTe single crystal substrate 21. N-type layer 23 is formed in p-type HgCdTe layer 22. The infrared image sensor is obtained by applying a mesa etching to layers 23 and 22 to form grooves 24. Naturally, the element isolation is performed by grooves 24.

It is also known to use as a substrate a multilayer structure prepared by repeatedly laminating a HgTe layer and a CdTe layer alternately in place of the alloy structure of HgCdTe used in the prior art described above. In this case, it is possible to set the effective band gap at a value sensitive to the infrared range by setting the thickness of each layer at 15 Å or more and the thickness of a repeating unit of the two-layer structure consisting of the HgTe layer and the CdTe layer to fall within the range of 30 to 300 Å. The substrate of a multi-layer structure is markedly advantageous over the alloy substrate as described in, for example, Smith, McGill and Schulman, *Appl. Phys. Lett.*, (1986), p 785. For example, the substrate of a multilayer structure readily permits forming an infrared image sensor of an optional band gap, permits diminishing the diffusing current in the p-type region, permits diminishing the dependence of the band gap on temperature, and also permits increasing the product of the junction resistance and the junction area which is an important diode characteristic.

However, various problems must be solved in order to use the multi-layer structure in the manufacture of a planar image sensor. For example, it may be possible to form a plurality of elements by selectively introducing an impurity into a multi-layer structure of a first conductivity type formed in advance so as to form second conductivity layers as shown in FIG. 1. In this method, however, it is difficult to isolate elements due to characteristics of the multi-layer structure. It may also be possible to form a multi-layer structure including a pn junction, followed by applying mesa etching for the element isolation as shown in FIG. 2. In this method, however, it is difficult to accurately form a number of fine elements arranged on a substrate for providing a fine infrared sensor.

As described above, a multi-layer structure prepared by alternately laminating a HgTe layer and a CdTe layer has attracted attention as an infrared detector material which can be used in place of HgCdTe. However, a planar infrared detector using the particular multilayer structure has not yet been put to practical use.

SUMMARY OF THE INVENTION

An object of the present invention is to provide a semiconductor light detecting device of a high sensitivity prepared by integrally forming a plurality of light detecting elements by utilizing a repeating multi-layer structure.

Another object is to provide a method of producing such a semiconductor light detecting device at a high accuracy.

According to the present invention, there is provided a semiconductor light detecting device having a plurality of light-detecting elements formed on a substrate, comprising a substrate; a first stacked layer of a first conductivity type formed on the substrate by alternately laminating repeatedly a compound semimetal layer and a compound semiconductor layer; a second stacked layer of a second conductivity type formed on the first stacked layer by alternately laminating the compound semimetal layer and the compound semiconductor layer repeatedly; and an isolation region for isolating a plurality of light-detecting elements from one another, said isolation region being formed by selectively irradiating the first and second stacked layers with an energy beam.

In the semiconductor light detecting device of the present invention, it is possible to use CdTe, CdZnTe, CdSeTe, GaAs or Si for forming the substrate. Concerning the compound semimetal layer and the compound semiconductor layer, it is possible to use combinations of, for example, HgTe/CdTe, HgTe/ZnTe, and HgTe/MnTe. It is possible to use as the first stacked layer a repeating multi-layer structure of p-type conductivity consisting of an undoped HgTe layer and As- or P-doped CdTe layer. Further, it is possible to use as the second stacked layer a repeating multi-layer structure of n-type conductivity consisting of an undoped HgTe layer and an undoped or In-doped CdTe layer. The energy beam used in the present invention for forming the isolation region includes, for example, a Nd:YAG laser applied with a Q-switch, a ruby laser applied with Q-switch, and an electron beam.

The present invention also provides a method of producing a semiconductor light detecting device having a plurality of light-detecting elements integrally arranged therein, comprising the steps of:

forming a first stacked layer of a first conductivity type by alternately laminating a compound semimetal layer and a compound semiconductor layer repeatedly on a substrate;

forming a second stacked layer of a second conductivity type by alternately laminating the compound semimetal layer and the compound semiconductor layer on the first stacked layer; and selectively irradiating the first and second stacked layers with an energy beam to convert the irradiated portion into a high resistance layer of a large band gap acting as an isolation region, thereby providing a plurality of light-detecting elements isolated from each other by the isolation region.

In the method of the present invention, combinations of, for example, HgTe/CdTe, HgTe/ZnTe, and HgTe/MnTe, can be used as the compound semimetal and the compound semiconductor. A repeating multi-layer structure consisting of, for example, HgTe and ZnTe has a band gap desirable as an infrared detector. Where each compound layer has a thickness of, for example, 70Å, the multi-layer structure has an effective band gap of about 0.12 eV and has an absorption band within the spectral range of 8-μm, i.e., a so-called "atmospheric window" range. On the other hand, it is known that a HgCdTe alloy has a band gap of about 0.6 eV where the atomic ratio of Hg to Cd is 1, as seen from Willardson and Beer, *Semiconductors and Semimetals*, Academic Press 18, 1981, page 7". In short, the HgCdTe alloy has a high resistance when undoped. In the present invention, a first stacked layer of an impurity-doped p-type conductivity is formed on a substrate by alternately laminating a HgTe layer and a CdTe layer repeatedly. Likewise, a second stacked layer of an undoped n-type conductivity is formed on the first stacked layer by alternately laminating the HgTe and CdTe layers repeatedly. Then, the structure comprising the first and second stacked layers is selectively irradiated with an energy beam. The irradiated region is alloyed to form an isolation region having a large band gap and a high resistance so as to form an infrared detector having a plurality of infrared detecting elements integrally formed therein and isolated from each other by the isolation region. It is important to note that the particular method of the present invention makes it possible to form the isolation region without destroying the multi-layer structure of the element region. It should also be noted that the element isolating technique utilizing the selective energy beam radiation is superior in controllability to, for example, the mesa etching process. It follows that the method of the present invention makes it possible to obtain a fine planar infrared detector with a higher accuracy.

As described above, the present invention provides a semiconductor light detecting device of a high sensitivity having a plurality of detecting elements integrally formed utilizing a repeating multi-layer structure.

BRIEF DESCRIPTION OF THE DRAWINGS

FIG. 3A is a perspective view showing an infrared sensor array according to one embodiment of the present invention;

FIG. 3B is a cross-sectional view of the infrared sensor array shown in FIG. 3A.

DETAILED DESCRIPTION OF THE PREFERRED EMBODIMENT

Figure 1:
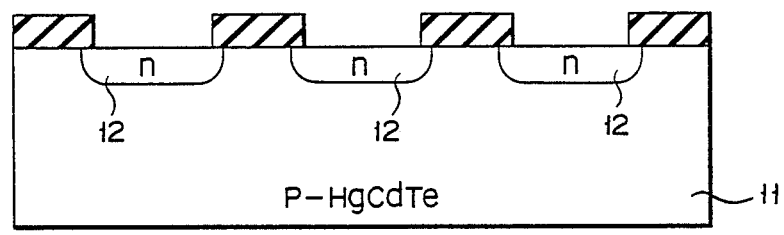
FIGS. 1 and 2 are cross-sectional views each showing a conventional infrared sensor array.
Figure 2:
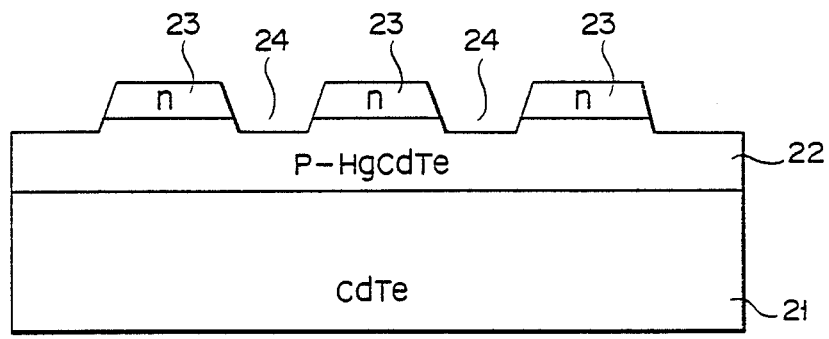

FIGS. 3A and 3B collectively show an infrared sensor array according to one embodiment of the present invention. The array as shown in the drawings was actually prepared as follows. Specifically, p-type layer 32 and n-type layer 33 each consisting of a repeating multi-layer structure of HgTe layers and CdTe layers were successively formed by a molecular beam epitaxy on CdTe single crystal substrate 31. P-type layer 32 was prepared by alternately forming 50 times an undoped HgTe layer having a thickness of 70Å and an As- or P-doped CdTe layer having a thickness of 70Å by epitaxial growth. Likewise, n-type layer 33 was prepared by alternately forming 30 times an undoped HgTe layer having a thickness of 70Å and an undoped CdTe layer having a thickness of 70Å by epitaxial growth. In forming the n-type layer 33, the CdTe layer may be doped with In. Molecular beams of Hg and Te were used for the epitaxial growth of the HgTe layer. Likewise, a molecular beam of CdTe was used for the epitaxial growth of the CdTe layer. Further, a molecular beam of As or P was used for the doping of As or P, with a molecular beam of In being used for the doping of In.

The resultant wafer of a repeating multi-layer structure having a pn junction was fixed on an X-Y stage capable of positioning the wafer with an accuracy of 1 μm for selectively irradiating the wafer with a Nd:YAG laser beam applied with a Q switch so as to form lattice-shaped isolation region 34. Specifically, the laser beam, which had a wavelength of 1.06 μm, a pulse time of 20 nsec. and an output of about 0.1 J/cm$^2$ for a single radiation, was narrowed to a diameter of about 2 μm and scanned on the wafer surface for alloying the irradiated portion so as to form isolation region 34. The alloying permits isolation region 34 to have a large band gap. Also, isolation region 34 has a high resistance because nominally n-type layer 33 is undoped.

The spectral sensitivity was measured at 77K in respect of the resultant 2×2 infrared sensor array. Each of the four detecting elements was found to have a cut off wavelength of about 11 μm, a quantum efficiency of at least 40%, and a detecting sensitivity of 2×10$^{10}$ cm Hz/W. The electric characteristics of the array were also measured. It was found that the product between the junction resistance Ro and area A was about 50 Ωcm$^2$ at 77K for each of the four detecting elements.

Figure 4:
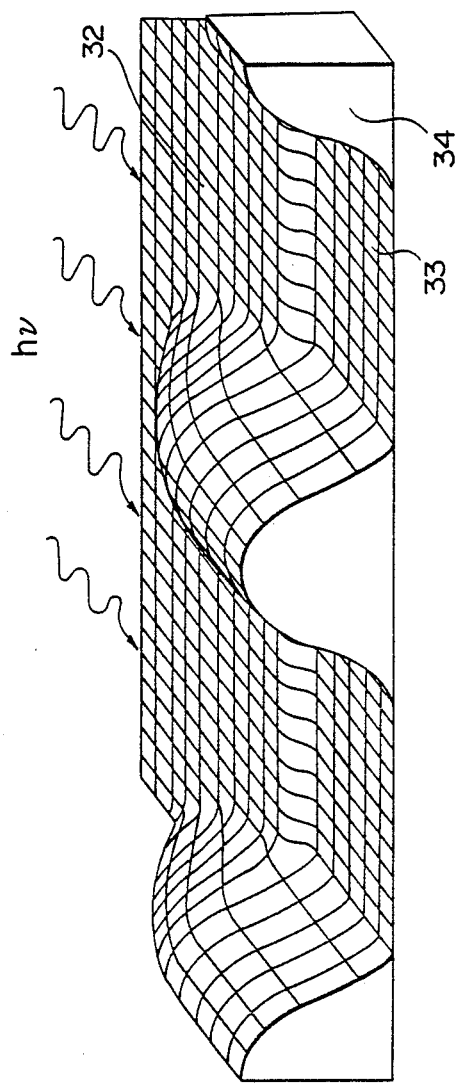
FIG. 4 shows the potential distribution of the conduction band in the infrared sensor array shown in FIGS. 3A and 3B.

FIG. 4 shows the potential distribution in the conduction band of the infrared sensor array obtained in the embodiment described above. As apparent from FIG. 4, isolation region 34 has a large band gap and a high resistance. It should be noted that the infrared rays incident on the substrate side are absorbed in p-type layer 32 so as to generate electrons. The electrons thus generated tend to flow into n-type layer 33. However, the barrier of isolation region 34 is so high as to inhibit the flow of the electrons therethrough. Also, the carrier-generating area is larger than the area of the pn junction, making it possible to permit the carrier to flow into the pn junction. It follows that it is possible to obtain a light detector of a high sensitivity.

In the embodiment described above, a repeating multi-layer structure of a small band gap is used as an active layer. In addition, an isolation region of a large band gap and a high resistivity is formed by annealing by means of a selective laser beam irradiation. These conditions combine to lead to an excellent infrared detector.

What is claimed is:

1. A semiconductor light detecting device having a plurality of light-detecting elements comprising:
    a substrate;
    a first stacked layer of a first conductivity type formed on the substrate by alternately laminating a compound semimetal layer and a compound semiconductor layer selected from the group consisting of the combinations of HgTe/CdTe, HgTe/ZnTe and HgTe/MnTe;

a second stacked layer of a second conductivity type formed on the first stacked layer by alternately laminating the compound semimetal layer and the compound semiconductor layer; and an isolation region for isolating a plurality of light-detecting elements from one another, said isolation region consisting essentially of an alloy being formed by selectively irradiating the first and second stacked layers with a laser beam.

2. The semiconductor light detecting device according to claim 1, wherein the material constituting the substrate is selected from the group consisting of CdTe, CdZnTe, CdSeTe, GaAs and Si.

3. The semiconductor light detecting device according to claim 1, wherein the first stacked layer is a p-type layer prepared by alternately laminating an undoped HgTe layer and as As- or P-doped CdTe layer repeatedly.

4. The semiconductor light detecting device according to claim 1, wherein the second stacked layer is an at least nominally n-type layer prepared by alternately laminating an undoped HgTe layer and a layer selected from the group of undoped CdTe layers and In-doped CdTe layers.

5. The semiconductor light detecting device according to claim 1, wherein the thickness of a pair of the compound semimetal and compound semiconductor layers falls within the range of between 30Å and 300Å.

6. A semiconductor light detecting device having a plurality of light-detecting elements comprising:

a substrate;

a first stacked layer of a first conductivity type formed on the substrate by alternately laminating a compound semimetal layer and a compound semiconductor layer selected from the group consisting of the combinations of HgTe/CdTe, HgTe/ZnTe and HgTe/MnTe;

a second stacked layer of a second conductivity type formed on the first stacked layer by alternately laminating the compound semimetal layer and the compound semiconductor layer; and an isolation region for isolating a plurality of light-detecting elements from one another, said isolation region consisting essentially of an alloy being formed by selectively irradiating the first and second stacked layers with an energy beam which is selected from the group consisting of a Nd:YAG laser applied with a Q switch; a ruby laser applied with a Q switch, and an electron beam.

* * * * *